(12) United States Patent
Sakayori (10) Patent No.: US 7,315,170 B2
(45) Date of Patent: Jan. 1, 2008

(54) CALIBRATION APPARATUS AND METHOD USING PULSE FOR FREQUENCY, PHASE, AND DELAY CHARACTERISTIC

(75) Inventor: Hiroshi Sakayori, Kanagawa (JP)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/389,847

(22) Filed: Mar. 27, 2006

(65) Prior Publication Data

US 2006/0241887 A1    Oct. 26, 2006

(30) Foreign Application Priority Data

Apr. 20, 2005    (JP) .............................. 2005-121955

(51) Int. Cl.
*G01R 35/00*    (2006.01)
*G01R 27/06*    (2006.01)

(52) U.S. Cl. ...................................... 324/601; 324/646

(58) Field of Classification Search ................ 324/601, 324/646, 642, 603

See application file for complete search history.

(56) References Cited

U.S. PATENT DOCUMENTS

| | | | | |
|---|---|---|---|---|
| 2,942,263 A | * | 6/1960 | Baldwin | 343/767 |
| 3,693,080 A | * | 9/1972 | Ross et al. | 324/638 |
| 3,796,948 A | * | 3/1974 | Wentworth | 324/630 |
| 4,621,226 A | * | 11/1986 | Powell | 324/649 |
| 6,920,407 B2 | * | 7/2005 | Adamian et al. | 702/104 |
| 2004/0027138 A1 | * | 2/2004 | Pickerd et al. | 324/646 |
| 2005/0027456 A1 | * | 2/2005 | Rosenberg et al. | 702/18 |

FOREIGN PATENT DOCUMENTS

JP    11-190760    7/1999    ................ 31/28

OTHER PUBLICATIONS

Hiwada et al.,; "Dynamic Test System for High Speed Mixed Signal Devices"; Yokogawa- Hewlett Packard; 1987; pp. 1-6.

* cited by examiner

*Primary Examiner*—Anjan Deb
(74) *Attorney, Agent, or Firm*—Ohlandt, Greeley, Ruggiero & Perle, L.L.P.

(57) ABSTRACT

In a device for measuring the properties of a device under test connected by a signal transmission path having reciprocity, a terminal on the device under test side of the signal transmission path is opened; pulse signals are transmitted to a terminal on the measuring apparatus side of the signal transmission path; the transmitted pulse signals are monitored and spectrum analyzed on the measuring apparatus; the pulse signals reflected from a terminal on the device under test side of the signal transmission path are monitored and spectrum analyzed on the measuring apparatus; and the frequency properties of propagation delay of the signal transmission path are found by referring to the coefficient obtained based on the impedance of the resistance load, the spectrum of the transmitted pulse signals, and the spectrum of the reflected pulse signals. The effect of an error is eliminated from the measuring results using the resulting frequency properties or propagation delay in actual measurement.

3 Claims, 5 Drawing Sheets

CALIBRATION APPARATUS AND METHOD USING PULSE FOR FREQUENCY, PHASE, AND DELAY CHARACTERISTIC

FIELD OF THE INVENTION

The present invention relates to a calibration method and a calibration apparatus for a measuring apparatus.

DISCUSSION OF THE BACKGROUND ART

A measuring apparatus is calibrated before measurement in order to accurately measure the properties of a device under test. The calibration of an apparatus for measuring the output signals of a device under test involves applying reference signals to a defining plane and monitoring these reference signals on the side of the measuring apparatus. A variety of signal sources can be used for the reference signal source, depending on the subject of the calibration. For instance, a high-precision, direct-current source is used to calibration direct-current accuracy. Moreover, a high-precision, sine-wave signal source is used to calibrate frequency properties. A high-precision pulse source is used to calibrate timing. A high-precision pulse source is also used to calibrate frequency properties (Kiyo Hiwada and Toshio Tamamura, "Dynamic Test System for High Speed Mixed Signal Devices," Transactions of International Test Conference, 1987, pp. 370-375.).

However, the terminals of the device under test are of various shapes and dispositions and there are therefore cases in which the measuring apparatus and the device under test are connected by a tool or interface, and the like. For instance, a semiconductor tester is used for a variety of devices under test; in such cases, it comprises a board that serves as an interface with the device under test and the main part of the measuring apparatus. The board can be a DUT board (device under test board) or a load board. Reference signals must be applied to the terminal of the device under test or close to this terminal in order to eliminate the measurement error attributed to the signal path between the device under test and the measuring apparatus. However, this is technologically difficult. For instance, a switch must be placed between the device under test and the measuring apparatus in order to apply reference signals close to the terminal of the device under test. In this case, the switch becomes a cause of measurement errors and these measurement errors cannot be eliminated by calibration. When reference signals are applied close to the terminal of a device under test of a semiconductor tester, the reference signals pass through the board. However, the board is the region that is free for the user and cannot be used by a system manufacturer; therefore, application of reference signals close to the terminal of a device under test is essentially impossible.

It should be noted that timing errors attributed to the signal path from the device under test to the measuring apparatus can be eliminated by TDR without applying signals near the terminal of the device under test (for instance, refer to JP Unexamined Patent Application (Kokai) 11[1999]-190,760 (page 2, FIG. 3)). This TDR method can only be used for the timing calibration of digital signal systems and cannot be used to calibrate other parameters, including analog system timing.

SUMMARY OF THE INVENTION

An object of the present invention is to provide a method and an apparatus with which multiple parameters can be corrected by using one reference signal. Another object of the present invention is to provide a method and an apparatus with which it is possible to correct the properties of an entire measuring apparatus or measuring system, including the signal transmission path between the device under test and the measuring apparatus.

The first subject of the invention is a method for calibrating frequency properties in an apparatus for measuring the properties of a device under test connected by a signal transmission path having reciprocity, characterized in that it comprises a step for connecting a resistance load to a terminal on the device under test side of the signal transmission path; a step for transmitting reference signals to a terminal on the measuring apparatus side of the signal transmission path; a step for monitoring and spectrum-analyzing of the transmitted reference signals on the measuring apparatus; a step for monitoring and spectrum analyzing, on the measuring apparatus, the reference signals reflected from a terminal on the device under test side of the signal transmission path; and a step for referring to the coefficient obtained based on the impedance of the resistance load, the spectrum of the transmitted reference signals, and the spectrum of the reflected reference signals, and finding the frequency properties of the signal transmission path.

The second subject of the invention is a method for calibrating timing properties in an apparatus for measuring the properties of a device under test connected by a signal transmission path having reciprocity, characterized in that it comprises a step for connecting a resistance load to a terminal on the device under test side of the signal transmission path; a step for transmitting reference signals to a terminal on the measuring apparatus side of the signal transmission path; a step for monitoring and analyzing the spectrum of the transmitted reference signals on the device under test; a step for monitoring and spectrum analyzing, on the measuring apparatus, the reference signals reflected from a terminal on the device under test side of the signal transmission path; and a step for referring to the spectrum of the transmitted reference signals and the spectrum of the reflected reference signals and finding the propagation delay of the signal transmission path.

The third subject of the invention is a method for calibrating frequency properties in an apparatus for measuring the properties of a device under test connected by a signal transmission path having reciprocity, characterized in that it comprises a step for connecting a resistance load to a terminal on the device under test side of a signal transmission path; a step for transmitting reference signals to a terminal on the measuring apparatus side of a signal transmission path; a step for monitoring and spectrum analyzing, on the measuring apparatus, the reference signals reflected from a terminal on the device under test side of the signal transmission path; and a step for referring to the coefficient obtained based on the impedance of the resistance load and the spectrum of the reflected reference signals and finding the frequency properties of the signal transmission path.

The fourth subject of the invention is the third subject of the invention, further characterized in that it also comprises a step for normalizing the reflected reference signals or spectrum of the reflected reference signals using the amplitude of the transmitted reference signals.

The fifth subject of the invention is the method in any of the first through fourth subjects, further characterized in that the reference signals are pulse signals.

The sixth subject of the invention is a method for calibrating frequency properties in an apparatus for measuring the properties of a device under test connected by a signal transmission path having reciprocity, characterized in that it comprises a step for connecting a resistance load to a terminal on the measuring apparatus side of the signal transmission path; a step for transmitting reference pulse signals to a terminal on the device under test side of the signal transmission path; a step for monitoring and spectrum analyzing, on the measuring apparatus, the reference pulse signals reflected from a terminal on the device under test side of the signal transmission path; and a step for referring to the spectrum of the reflected reference signals and finding the relative propagation delay of the signal transmission path.

The seventh subject of the invention is the method in any of the first through sixth subjects, further characterized in that the resistance load is a short circuit.

The eighth subject of the invention is an apparatus for measuring the properties of a device under test connected by a signal transmission path having reciprocity, characterized in that it comprises a signal generator for transmitting reference signals to a terminal on the measuring apparatus side of a signal transmission path; a means for monitoring and analyzing the spectrum of the transmitted reference signals on the device under test; a means for monitoring and spectrum analyzing, on the measuring apparatus, the reference signals reflected from a terminal on the device under test side of the signal transmission path; and a means for referring to the coefficient obtained based on the impedance of the resistance load connected to a terminal on the device under test side of the signal transmission path, the spectrum of the transmitted reference signals, and the spectrum of the reflected reference signals, and finding the frequency properties of the signal transmission path, wherein the measurement error attributed to the signal transmission path can be eliminated from the measurement results by referring to the frequency properties.

The ninth subject of the invention is an apparatus for measuring the properties of a device under test connected by a signal transmission path having reciprocity, characterized in that it comprises a means for transmitting reference signals to a terminal on the measuring apparatus side of a signal transmission path; a means for monitoring and analyzing the spectrum of the transmitted reference signals on the measuring apparatus; a means for monitoring and spectrum analyzing, on the measuring apparatus, the reference signals reflected from a terminal on the side of the device under test of a signal transmission path; and a means for referring to the spectrum of the transmitted reference signals, the spectrum of the reflected reference signals, and the coefficient obtained based on the impedance of the resistance load connected to a terminal on the device under test side of the signal transmission path, and finding the propagation delay of the signal transmission path, wherein the measurement error attributed to the signal transmission path can be eliminated from the measurement results by referring to the propagation delay.

The tenth subject of the invention is an apparatus for measuring the properties of a device under test connected by a signal transmission path with reciprocity, characterized in that it comprises a means for transmitting reference signals to a terminal on the measuring apparatus side of the signal transmission path; a means for monitoring and spectrum analyzing, on the measuring apparatus, the reference signals reflected from a terminal on the device under test side of the signal transmission path; and a means for referring to the coefficient obtained based on the impedance of the resistance load connected to a terminal on the device under test side of the signal transmission path and the spectrum of the reflected reference signals, and finding the frequency properties of the signal transmission path, wherein the measurement error attributed to the signal transmission path can be eliminated from the measurement results by referring to the frequency properties.

The eleventh subject of the invention is characterized in that the tenth subject also has a means for normalizing the reflected reference signals or spectrum of the reflected reference signals using the amplitude of the transmitted reference signals.

The twelfth subject of the invention is the apparatus in any of the eighth through the eleventh subjects, further characterized in that the reference signals are pulse signals.

The thirteenth subject of the invention is an apparatus for measuring the properties of a device under test connected by a signal transmission line having reciprocity, characterized in that it comprises a means for transmitting reference signals to a terminal on the measuring apparatus side of the signal transmission path; a means for monitoring and spectrum analyzing, on the measuring apparatus, the reference signals reflected from a terminal on the device under test side of the signal transmission path; and a means for referring to the spectrum of the reflected reference signals and finding the relative propagation delay of the signal transmission path.

The fourteenth subject of the invention is any of the eighth through thirteenth subjects, further characterized in that the resistance load is an open circuit.

The present invention provides a method and an apparatus with which multiple parameters can be corrected using one reference signal. The present invention also provides a method and an apparatus with which it is possible to correct the properties of an entire measuring apparatus or measuring system, including the signal transmission path between a device under test and the measuring apparatus. The present invention makes it possible to find the propagation delay with greater precision than in the past because the propagation delay is derived from the phase of the spectrum.

DETAILED DESCRIPTION OF THE PREFERRED EMBODIMENT

Figure 1:
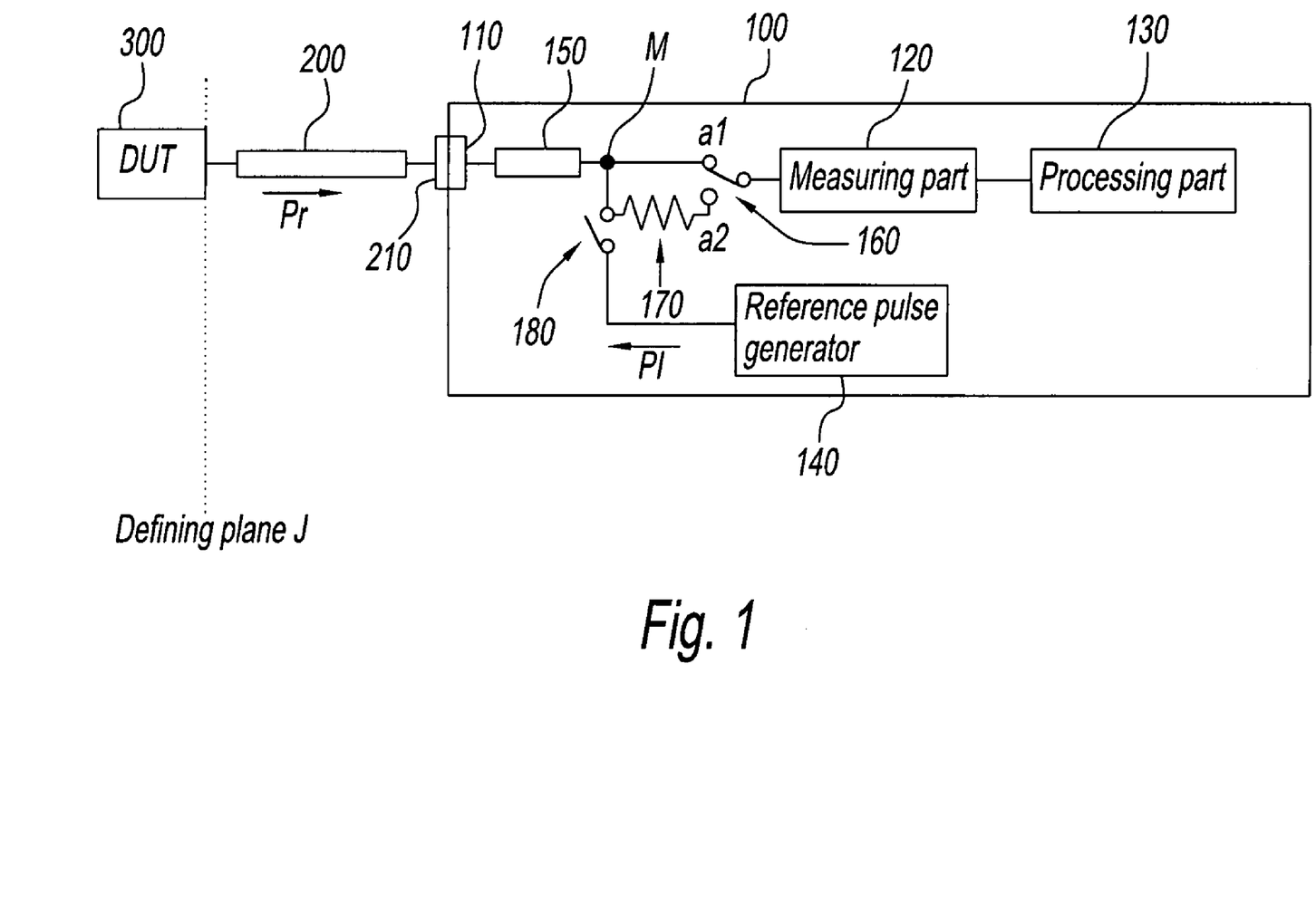
FIG. 1 is a schematic diagram showing a measuring apparatus 100, the first embodiment of the present invention.

Embodiments of the present invention will now be described while referring to the attached drawings. Refer to FIG. 1. FIG. 1 is a block diagram of a measuring apparatus 100, which is the first embodiment of the present invention. Measuring apparatus 100 in FIG. 1 comprises a connector 110, a measuring part 120, a processing part 130, and a reference signal generator 140. Measuring part 120 is the apparatus that measures the signal. Moreover, measuring part 120 has the function of monitoring the signal waveshape. Processing part 130 is the apparatus that processes the output signals of measuring part 120. Reference signal generator 140 is the apparatus that outputs a step pulse. The amplitude of the pulse signals that are output when reference signal generator 140 is under no load is A. There is a transmission line 150 between connector 110 and measuring part 120. Transmission line 150 is the line for transmitting signals inside measuring apparatus 100 and is, for instance, a cable or strip line. There is a switch 160 between transmission line 150 and measuring part 120. Switch 160 is the switch for connecting measuring part 120 to transmission line 150, directly, or via a resistor 170. A switch 180 is placed between transmission line 150 and reference signal generator 140. Switch 180 is the switch for selectively switching between transmission line 150 and reference signal generator 140.

It should be noted that Z is the input impedance of measuring part 120 and the output impedance of the reference signal generator. Moreover, Z is also the characteristic impedance of connector 110, transmission line 150, switch 160, switch 180, and a transmission line 200. The connection lines in the figure do not affect the circuit. For instance, the physical length and the electrical length of the connection lines are shorter than the other elements.

Measuring apparatus 100 is connected to a device under test 300 by transmission line 200. Transmission line 200 is a line for transmitting signals and is, for instance, a cable or strip line. Transmission line 200 is connected to connector 110 of measuring apparatus 100 through a connector 210.

Next, the calibration procedure for measuring apparatus 100 is described below while referring to FIGS. 1 and 2. By means of the present embodiment, transmission line 200 and device under test 300 are separated and calibrated at a defining plane J.

Figure 2:
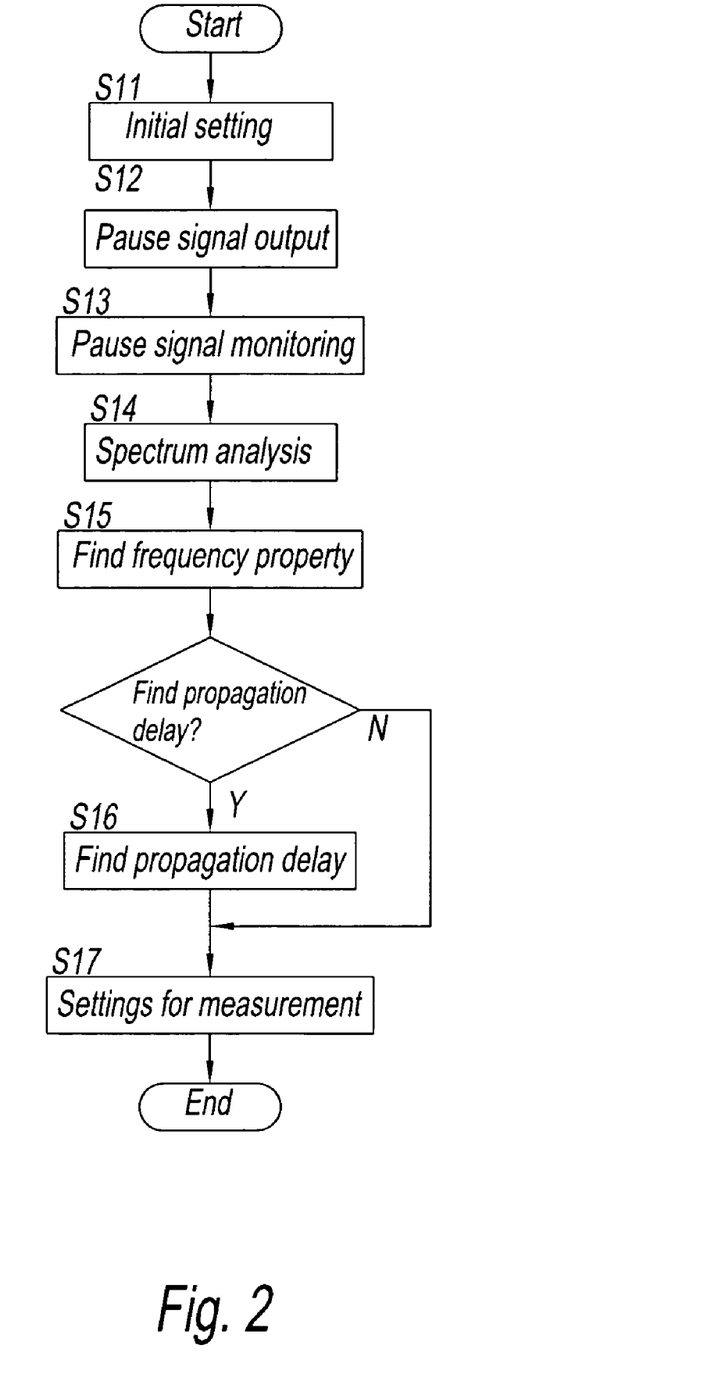
FIG. 2 is a flow chart showing the calibration procedure in the first embodiment of the present invention.

FIG. 2 is the flow chart showing the calibration procedure for measuring apparatus 100.

First, the initial settings for calibration are performed at step S11. Specifically, switch 160 is switched to the a2 side. Moreover, switch 180 is turned on. Device under test 300 is cut off from transmission line 200.

Next, in step S12, a pulse signal Pi, which is a reference signal, is transmitted from reference signal generator 140. The amplitude of pulse signal Pi becomes A/2 as a result of the voltage dividing effect of the impedance of the load connected to reference signal generator 140 and the output impedance of reference signal generator 140. The amplitude of pulse signal Pi (A/2) is Ei.

When a pulse signal Pi is transmitted from reference signal generator 140, it reaches measuring part 120 after passing through switch 180 and resistor 170. Moreover, the pulse signal Pi reaches transmission line 200 after passing through switch 180, transmission line 150, and connectors 110 and 210, in succession. A terminal on the device under test 300 side of transmission line 200 is opened. Therefore, the pulse signal Pi is reflected at the same amplitude without changing polarity at a terminal on the device under test 300 side of transmission line 200. The amplitude of a pulse signal Pr becomes Er here. Pulse signal Pr reaches measuring part 120 after passing through transmission line 200, connectors 210 and 110, and resistor 170.

Figure 3:
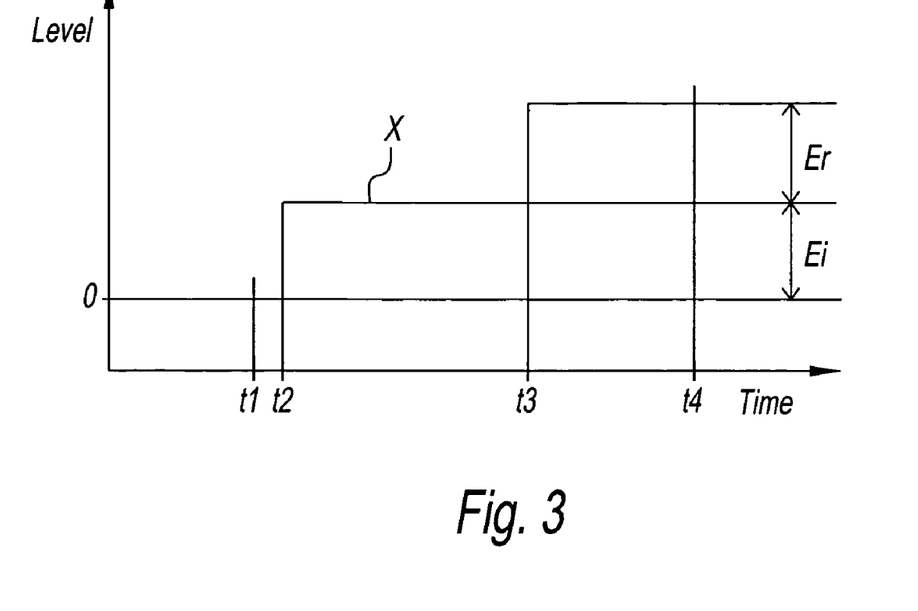
FIG. 3 is a drawing showing a signal waveshape X.

Refer to FIG. 3. FIG. 3 shows the monitored signal waveshape X for the input of measuring part 120. The y-axis in FIG. 3 represents the signal amplitude level, and the x-axis represents time. The pulse that rises at time t2 is the pulse signal Pi. Moreover, the pulse that rises at time t3 is the pulse signal Pr. The flat part after the rise in the pulse signal Pi is long; therefore, pulse signal Pr overlaps pulse signal Pi. The difference between time t2 and time t3 in FIG. 3 corresponds to twice the sum of the electrical length of transmission line 200 and the electrical length of transmission line 150. Refer to FIGS. 1, 2, and 3 below.

Next, a signal waveshape X comprising pulse signal Pi and pulse signal Pr is monitored by measuring part 120. For instance, measuring part 120 samples and performs analog-to-digital conversion of waveshape X within a range from a start point t1 to an end point t4. The sampling frequency is set so that it is sufficiently higher than the frequency bandwidth of pulse signal Pi and pulse signal Pr so that the desired frequency resolution is obtained. Start point t1 is also set before time t2. Moreover, the sampling time, that is, the difference between start point t1 and end point t4, is set so that sufficient resolution is obtained by the spectrum analysis that is discussed later. The converted signal waveshapes X are allowed to accumulate in measuring part 120 and used in future processing. The converted signal waveshapes X can also be stored in another device, such as processing part 130.

Figure 4:
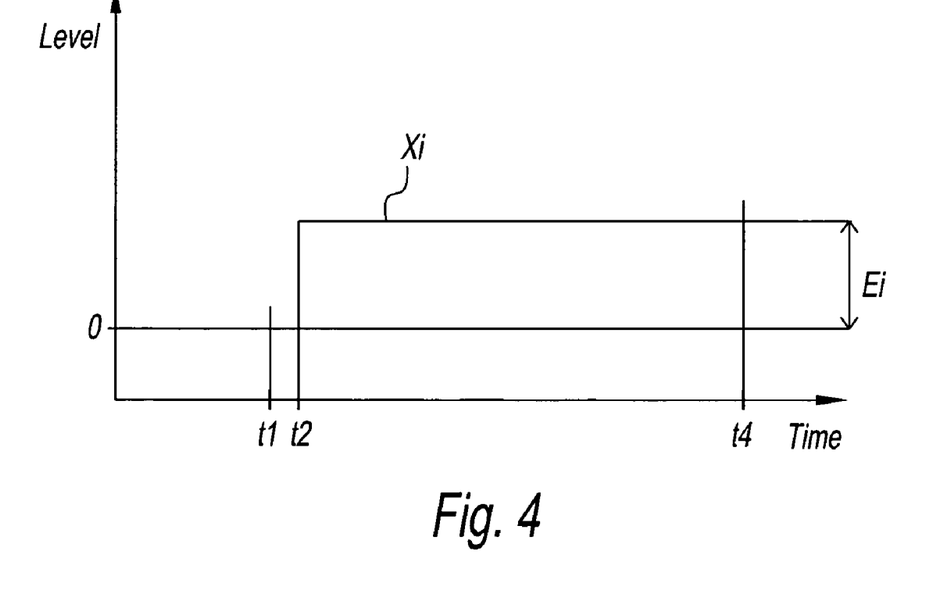
FIG. 4 is a drawing showing a signal waveshape Xi.
Figure 5:
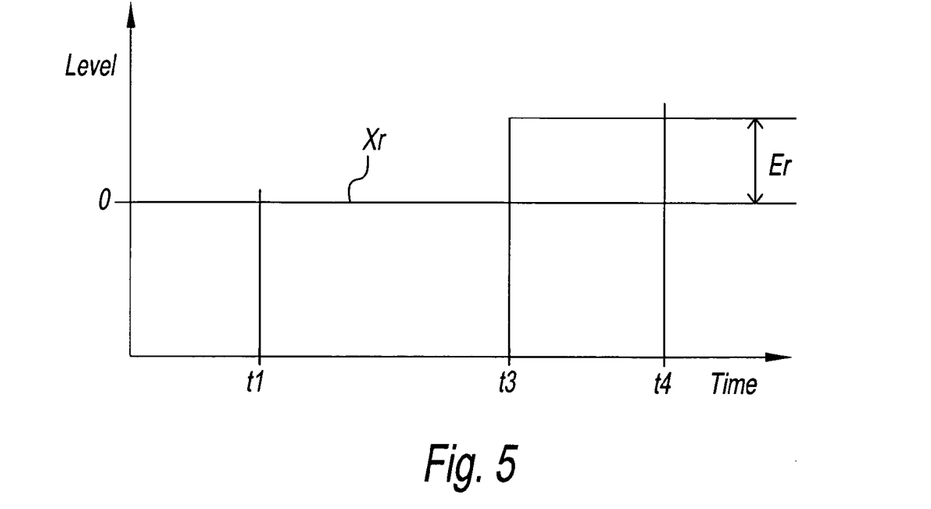
FIG. 5 is a drawing showing a signal waveshape Xr.

Next, pulse signal Pi and pulse signal Pr are individually extracted from the accumulated signal waveshapes X at step S14 and each pulse signal is spectrum analyzed. First, of the stored signal waveshapes X, the signal waveshape that has been fixed at amplitude Ei beginning at time t3 serves as Xi. FIG. 4 shows the signal waveshape Xi obtained at this time. This signal waveshape Xi represents pulse signal Pi. Next, the DC offset Ei is subtracted from the stored signal waveshapes X and the amplitude before time t3 is fixed at 0 to obtain Xr. FIG. 5 shows the signal waveshape Xr obtained in this case. This signal waveshape represents pulse signal Pr. Moreover, the spectra of signal waveshape Xi and signal waveshape Xr are found. For instance, a spectrum Si is obtained by FFT processing of signal waveshape Xi. A spectrum Sr is obtained by FFT processing of signal waveshape Xr.

The frequency properties of a signal transmission path F between a point M and defining plane J are found in Step S15. As long as signal transmission path F has reciprocity, the frequency properties of signal transmission path F can be found from the vector ratio of spectrum Si and spectrum Sr. Signal transmission path F includes all elements that transmit signals. Consequently, in the present embodiment, signal transmission path F comprises not only transmission lines 150 and 200, but also connectors 110 and 210. Signal transmission path F has reciprocity in the present embodiment. Moreover, the frequency properties are both the frequency-amplitude property and the frequency-phase property. The frequency-amplitude property is also referred to simply as the amplitude property hereinafter. Moreover, the frequency-phase property is also simply referred to as the phase property.

The amplitude property $|H(\omega)|$ and the phase property $\phi(\omega)$ when a resistance load is connected to a terminal (defining plane J) on the device under test 300 side of signal transmission path F are obtained by the following formulas. It should be noted that the resistance loads can always bring about constant reflection regardless of time. Examples of resistance loads are open circuit (the present embodiment), short circuit, resistors, and the like.

[Mathematical formula 1]

$$|H(\omega)| = \left|\sqrt{k\frac{Sr(\omega)}{Si(\omega)}}\right| \quad (1)$$

[Mathematical formula 2]

$$\varphi(\omega) = \frac{1}{2}\left[\arg\left(\frac{Sr(\omega)}{Si(\omega)}\right)\right] \quad (2)$$

[Mathematical formula 3]

$$k = \frac{Z_L + Z_O}{Z_L - Z_O} \quad (3)$$

Here, arg( ) is the function for finding the argument (rad) of the value in parentheses. When the phase fluctuation is large, arg( ) should output an unwrapped phase. Moreover, Zo is the characteristic impedance of signal transmission path F. $Z_L$ is the impedance (resistance or characteristic impedance) of the resistance load connected to a terminal on the device under test 300 side of signal transmission path F. $Z_L$ is infinitely large in the present embodiment; therefore, k is 1. Spectrum Sr and spectrum Si in the above-mentioned formulas are vector values.

The amplitude property |H(ω)| and the phase property φ(ω) obtained by the above-mentioned formulas are stored until actual measurement. When the propagation delay of signal transmission path F is not found, the system proceeds to step S17 and processing ends.

Next, a propagation delay td(ω) of signal transmission path F is found from phase property φ(ω). Propagation delay td(ω) is found by the following formula. Propagation delay td(ω) obtained by the following formula is stored until actual measurement.

[Mathematical formula 4]

$$td(\omega) = -\frac{d\varphi}{d\omega} \quad (4)$$

Finally, the measurement settings are implemented in step S17. Specifically switch 160 is switched to a1. Moreover, switch 180 is turned off. Device under test 300 is connected to transmission line 200. This step is executed as necessary. For instance, this step is not necessary when repeating a calibration.

The frequency-amplitude property, the frequency-phase property, and the propagation delay obtained by the above-mentioned procedure are referred to when eliminating the effect of signal transmission path F on the results of actual measurements from the measurement results.

However, when pulse signal Pi is regarded as a high-precision step pulse, the frequency-amplitude property and frequency-phase property can be found by a method that is different from the above-mentioned. This method will be described as a second embodiment of the invention. The high-precision step pulse is a pulse having a pulse transition time that is sufficiently shorter than the pulse response of the subject of the calibration, has no sag and little ringing or overshoot in the flat part of the waveshape.

Figure 6:
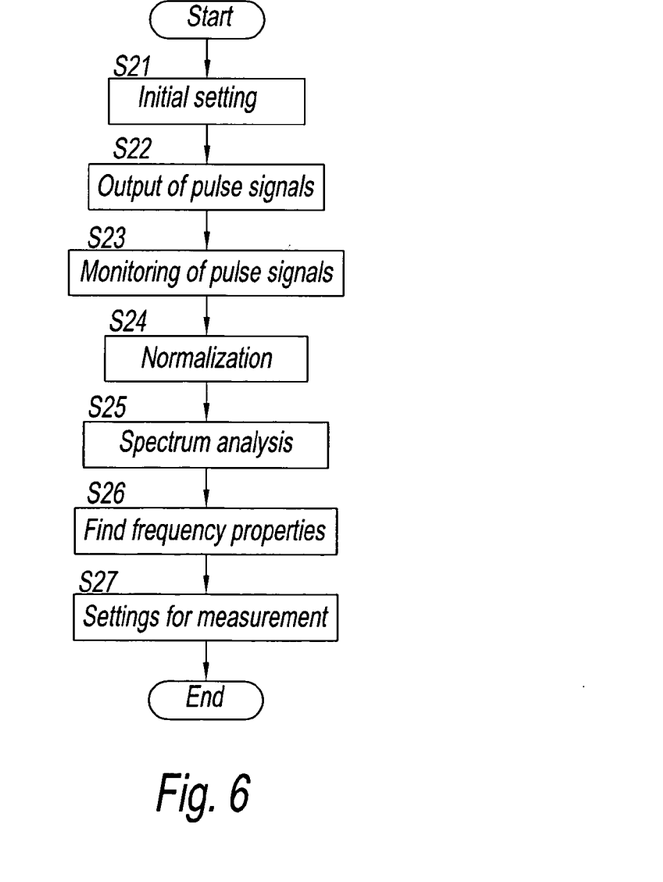
FIG. 6 is a flow chart showing the calibration procedure in the second embodiment of the present invention.

Refer to FIGS. 1 and 6. In the second embodiment, measuring apparatus 100 is calibrated by the following procedure. The second embodiment is one wherein calibration is performed at defining plane J as in the first embodiment. FIG. 6 shows the flow chart of a different calibration procedure for measuring apparatus 100.

First, the initial settings for calibration are performed at step S21. Next, pulse signal Pi, which is the reference signal, is transmitted from reference signal generator 140 at step S22. Steps S21 and S22 are the same as steps S11 and S12 in FIG. 2 and are therefore not described in detail.

Figure 7:
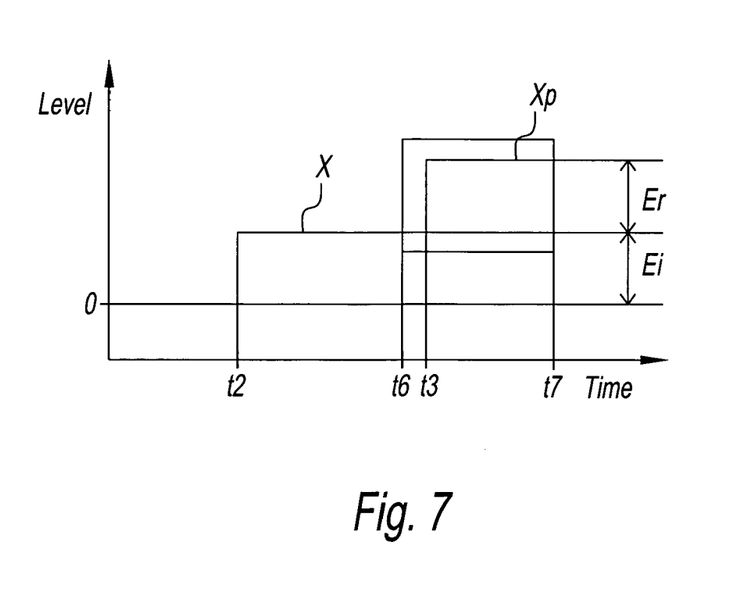
FIG. 7 is a drawing showing a signal waveshape X.

Refer to FIG. 7. FIG. 7 shows a signal waveshape X that is monitored at the input of measuring part 120. Signal waveshape X is the same as shown in FIG. 3. The y-axis in FIG. 7 indicates the signal amplitude level and the x-axis indicates time. Refer to FIGS. 1, 6, and 7.

Signal waveshape X that includes pulse signal Pr is monitored by measuring part 120 in step S23. For instance, measuring part 120 samples and performs analog-to-digital conversion of signal waveshape X within the range from a start point t6 to an end point T7. The sampling frequency is set so that it is sufficiently higher than the frequency bandwidth of pulse signal Pr so that the desired frequency resolution is obtained. Start point t6 is also set before time t7. Moreover, the sampling time, that is, the difference between start point t6 and end point t7, is set so that sufficient resolution is obtained by the spectrum analysis that is discussed later. The converted signal waveshapes Xp are allowed to accumulate in measuring part 120 and used in future processing. The converted signal waveshapes Xp can also be stored in another device, such as processing part 130.

Next, the stored signal waveshapes Xp are normalized by the amplification of pulse signal Pi in step S24. The amplitude of pulse signal Pi can be actually measured, or the theoretical amplitude can be used. Normalization can be performed after the spectrum analysis that is described later. It should be noted that this step is conducted as needed. For instance, when looking for a 3 dB bandwidth only, this step is not necessary.

Next, the stored signal waveshape Xp is spectrum analyzed in step S25. First, DC offset Ei is subtracted from signal waveshape Xp and further time differentiated to obtain signal waveshape Xd (not illustrated). The spectrum of signal waveshape Xd is found. For instance, spectrum Sd is obtained by FFT processing of signal waveshape Xd.

The frequency properties of a signal transmission path F between a point M and defining plane J are found in step S26. The frequency properties are both the frequency-amplitude property and frequency-phase property. Moreover, signal transmission path F includes all elements that transmit signals. Consequently, in the present embodiment signal transmission path F comprises not only transmission lines 150 and 200, but also connectors 110 and 210.

Signal transmission path F has reciprocity in the present embodiment. The amplitude property |H(ω)| and the phase property φ(ω) when a resistance load is connected to a terminal (defining plane J) on the device under test 300 side of signal transmission path F are obtained by the following formulas. It should be noted that the resistance load is the same as previously described.

[Mathematical formula 5]

$$|H(\omega)| = |\sqrt{k \cdot Sd(\omega)}| \quad (5)$$

[Mathematical formula 6]

$$\varphi(\omega) = \frac{1}{2}\arg[Sd(\omega)] \quad (6)$$

-continued

[Mathematical formula 7]

$$k = \frac{Z_L + Z_O}{Z_L - Z_O} \quad (7)$$

Here, arg( ), Zo, $Z_L$, and k are the same as previously described. Spectrum Sd is a vector value in the above-mentioned formulas.

The amplitude property $|H(\omega)|$ and the phase property $\phi(\omega)$ obtained by the above-mentioned formula are stored until actual measurement.

Finally, the measurement settings are implemented in step S27. Specifically, switch 160 is switched to a1. Moreover, switch 180 is turned off. This step is executed as necessary. For instance, this step is not necessary when repeating a calibration.

The frequency-amplitude property, the frequency-phase property, and the propagation delay obtained by the above-mentioned procedure are referred to when eliminating the effect of signal transmission path F on the results of actual measurements from the measurement results.

Each of the embodiments described thus far can be modified as shown below. For instance, in the first embodiment, pulse signal Pi can be regarded as a step pulse only between t1 and t4; pulse signal Pi is not necessarily a fully stepped pulse. Moreover, pulse signal Pi in the first embodiment can be a signal that includes a component within the frequency bandwidth to be calibrated; pulse signal Pi is not necessarily a step pulse. Pulse signal Pi in the first embodiment can be a multicarrier signal. Furthermore, pulse signal Pi in the second embodiment can be regarded as a step pulse between t6 and t7 only; pulse Pi is not necessarily a fully stepped pulse.

Moreover, the transmitted step pulse in the above-mentioned two embodiments can be a step pulse during the sampling period; therefore, various modifications are possible. For instance, the flat part in the step pulse after the rise can be of finite length. Moreover, the step pulse can also be a repeating pulse.

Furthermore, the above-mentioned two embodiments assume that measuring part 120 has ideal properties. However, there are actually cases where measuring part 120 contains sources of error. In order to eliminate these error sources, a calibration of measuring part 120 can be added. The calibration of measuring part 120 can be accomplished by a spectrum comparison of pulse signal Pi that is actually received by measuring part 120 and the theoretical waveshape of the pulse signal transmitted by reference signal generator 140. The frequency properties, etc., of measuring part 120 can be found from the results of a spectrum comparison by using the analytical methods described in the first and second embodiments. The calibration of measuring part 120 can be conducted before the calibration of the signal transmission path or after the calibration of the signal transmission path.

WORKING EXAMPLE 1

The skew between signal transmission lines connected to each of multiple measuring apparatuses can be adjusted by using the calibration method described in the first embodiment.

A working example of the present invention will be described below while referring to the attached drawings.

Figure 8:
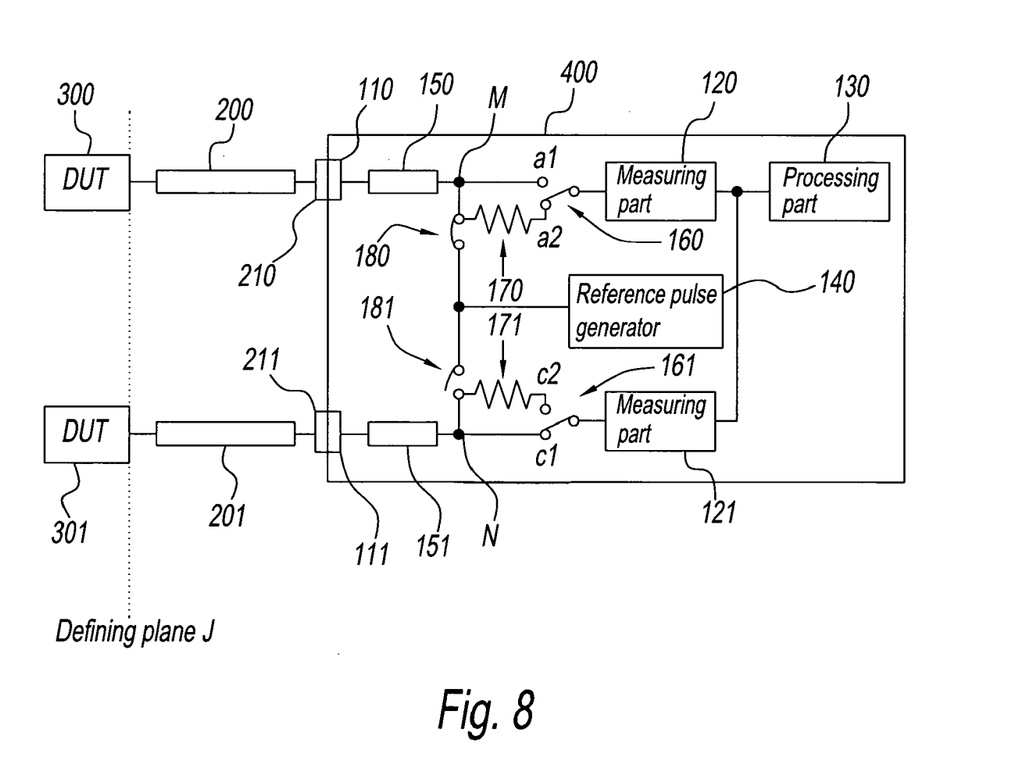
FIG. 8 is a drawing showing the schematic diagram of a measuring apparatus 400 of Working Example 1.

Refer to FIG. 8. FIG. 8 shows a block diagram of a measuring apparatus 400, which is the first working example of the present invention. Measuring apparatus 400 in FIG. 8 comprises measuring apparatus 100 shown in FIG. 1. Consequently, a detailed description of the structural elements having the same reference numbers as in FIG. 1 is omitted.

Measuring apparatus 400 in FIG. 8 also comprises a connector 111, a measuring part 121, and a processing part 130. Measuring part 121 is the apparatus for measuring signals. Measuring part 121 also has a function for monitoring the signal waveshape. Processing part 131 is an apparatus for processing the output signals of measuring part 121, and is connected to measuring part 121. A transmission line 151 is disposed in between connector 111 and measuring part 121. Transmission line 151 is a line for transmitting signals and is, for instance, a cable or strip line. A switch 161 is disposed between transmission line 151 and measuring part 121. Switch 161 is a switch for connecting measuring part 121 to transmission line 151, directly or with a resistor 171 in between. A switch 181 is disposed in between transmission line 151 and reference signal generator 140. Switch 181 is the switch for selectively connecting transmission line 151 and reference signal generator 140.

It should be noted that Z is the input impedance of measuring part 121 and the output impedance of the reference signal generator. Moreover, Z is also the characteristic impedance of connector 111, transmission line 151, switch 161, switch 181, and a transmission line 201. The connection lines in the figure do not affect the circuit. For instance, the physical length and the electrical length of the connection lines are shorter than the other elements.

Measuring apparatus 400 is connected to a device under test 301 by transmission line 201. Transmission line 201 is a line for transmitting signals and is, for instance, a cable or strip line. Transmission line 201 is connected to connector 111 of measuring apparatus 400 through a connector 211.

Skew is adjusted by the following procedure in the first embodiment. First, a resistance load is connected in place of device under test 300, switch 160 is switched to the a2 side, and switch 180 is turned on. Moreover, pulse signals are transmitted by reference signal generator 140 and the transmitted and reflected pulses are monitored at measuring part 120. The propagation delay of a signal transmission path F between a point M and defining plane J is found by processing part 130 based on the monitored waveshape. Next, a resistance load is connected in place of device under test 301, switch 161 is switched to the c2 side, switch 180 is turned off, and switch 181 is turned on. Pulse signals are transmitted by reference signal generator 140 and the transmitted and reflected pulses are monitored by measuring part 121. The propagation delay of signal transmission path F between a point N and defining plane J is found by processing part 130 based on this monitored waveshape. The difference between the two propagation delays found by the above-mentioned procedure is the skew between signal transmission paths. The compensation of this skew is performed, for instance, by adding a delay component to the signal transmission path, or hypothetically adding a delay component by processing after measurement.

WORKING EXAMPLE 2

Moreover, the skew between signal transmission paths that are connected to each of multiple measuring apparatuses can also be adjusted by using the calibration method described in the second embodiment. The skew adjustment procedure in this case is basically the same as for the first working example. What is different is how the signals are monitored. By means of the second working example, it is necessary to provide a starting point for monitoring the reflected signals. In other words, the (relative) time position of the point when monitoring pulse signals transmitted from reference signal generator 140 is set at the same point. Thus, the phase property corresponding to each signal transmission path is obtained by monitoring and spectrum analysis in this way. When time differentiation is performed on this phase property, a relative propagation delay is obtained wherein the monitoring start point serves as the reference time point. The skew between the signal transmission paths is ascertained by comparing this propagation delay. The compensation procedure is the same as previously described.

What is claimed is:

1. A method for calibrating frequency properties in an apparatus for measuring the properties of a device under test connected by a signal transmission path having reciprocity, said method comprising:
   connecting an open circuit as a resistance load to a terminal on the device under test side of the signal transmission path;
   transmitting step pulse signals as reference signals to a terminal on the measuring apparatus side of the signal transmission path;
   monitoring and analyzing the spectrum of the transmitted reference signals on the measuring apparatus by a Fourier transform;
   monitoring and spectrum analyzing, on the measuring apparatus, the reference signals reflected from a terminal on the device under test side of the signal transmission path by a Fourier transform; and
   referring to the coefficient obtained based on the impedance of the resistance load, the spectrum of the transmitted reference signals, and the spectrum of the reflected reference signals, and finding the frequency properties of the signal transmission path.

2. A method for calibrating frequency properties in an apparatus for measuring the properties of a device under test connected by a signal transmission path having reciprocity, said method comprising:
   connecting an open circuit as a resistance load to a terminal on the device under test side of a signal transmission path;
   transmitting step pulse signals as reference signals to a terminal on the measuring apparatus side of a signal transmission path;
   monitoring and spectrum analyzing, on the measuring apparatus, the reference signals reflected from a terminal on the device under test side of the signal transmission path by a Fourier transform; and
   referring to the coefficient obtained based on the impedance of the resistance load and the spectrum of the reflected reference signals and finding the frequency properties of the signal transmission path.

3. The method cited in claim 2, further comprising: normalizing the reflected reference signals or spectrum of the reflected reference signals using the amplitude of the transmitted reference signals.

* * * * *